(12) United States Patent
Bude et al.

(10) Patent No.: US 6,528,845 B1
(45) Date of Patent: Mar. 4, 2003

(54) NON-VOLATILE SEMICONDUCTOR MEMORY CELL UTILIZING TRAPPED CHARGE GENERATED BY CHANNEL-INITIATED SECONDARY ELECTRON INJECTION

(75) Inventors: Jeffrey D. Bude, New Providence, NJ (US); Richard J. McPartland, Nazareth, PA (US); Ranbir Singh, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/616,569

(22) Filed: Jul. 14, 2000

(51) Int. Cl.[7] .............................................. H01L 29/792
(52) U.S. Cl. ...................................................... 257/324
(58) Field of Search ......................................... 257/324

(56) References Cited

U.S. PATENT DOCUMENTS

| | | | |
|---|---|---|---|
| 4,859,619 A | * | 8/1989 | Wu et al. .................... 438/201 |
| 5,168,334 A | | 12/1992 | Mitchell et al. |
| 5,349,221 A | * | 9/1994 | Shimoji ...................... 257/324 |
| 5,659,504 A | | 8/1997 | Bude et al. |
| 5,740,104 A | * | 4/1998 | Forbes .................. 365/185.03 |
| 5,768,192 A | | 6/1998 | Eitan |
| 5,790,460 A | * | 8/1998 | Chen et al. ............ 365/185.29 |
| 6,187,635 B1 | * | 2/2001 | Kaya ........................... 438/264 |

FOREIGN PATENT DOCUMENTS

WO   WO-82/04162   * 11/1982   ................. 257/324

* cited by examiner

Primary Examiner—Olik Chaudhuri
Assistant Examiner—Howard Weiss
(74) Attorney, Agent, or Firm—Hitt, Gaines & Boisbrun

(57) ABSTRACT

The present invention provides a semiconductor device that comprises a tub region located in a semiconductor substrate, wherein the tub region has a tub electrical contact connected thereto. The semiconductor device further comprises a trap charge insulator layer located on the first insulator layer and a control gate located over the trap charge insulator layer. The control gate has a gate contact connected thereto for providing a second bias voltage to the semiconductor device that, during programming, is opposite in polarity to that of the first bias voltage.

27 Claims, 5 Drawing Sheets

NON-VOLATILE SEMICONDUCTOR MEMORY CELL UTILIZING TRAPPED CHARGE GENERATED BY CHANNEL-INITIATED SECONDARY ELECTRON INJECTION

TECHNICAL FIELD OF THE INVENTION

The present invention is directed, in general, to an integrated circuit and, more specifically, to a non-volatile semiconductor memory cell utilizing a trap charge layer and a channel-initiated secondary electron injection (CISEI) structure.

BACKGROUND OF THE INVENTION

Erasable programmable read-only memory (EPROM) devices, including electrically erasable programmable read-only memory (EEPROM) devices, and flash EEPROM devices, are currently in extensive use today, being used in a multitude of telecommunications and computer applications. Because of small memory cell and array size, EEPROM memories have a significant cost advantage over conventional static random access memory (SRAM) devices. Furthermore, EPROM devices are more compatible with complimentary metal oxide semiconductor (CMOS) logic technologies than are dynamic random access memory (DRAM) devices, making them more suitable for system-on-a-chip embedded applications. However, there are problems to the widespread use of embedded EPROM devices that exist.

One such problem is the high row voltage required for programming. Programming flash EEPROM cells is done by raising cell voltage to above drain voltage (VDD), in order to impart enough energy for electrons in the channel of the transistor to become accelerated (i.e., "hot") and thereby be injected into the gate oxide. This is referred to as hot electron injection (CHEI). To accelerate the electrons to become hot, typical gate to source (Vgs) voltage is 7 to 12 volts, where typical VDD voltage may be 2.5 volts. Also, the drain to source voltage (Vds) needed is typically 6 to 10 volts. However, low voltage CMOS logic transistors are generally unable to generate and switch such voltages. Thus, in low voltage CMOS technologies, costly, additional processing is needed for fabrication of transistors able to withstand high voltage.

In addition to the requirements spelled out above, to generate high voltages at sufficient current, about 200 $\mu$A/cell, complicated, large charge pumping circuits may be required to be manufactured within the CMOS device. These large charge pumping circuits are costly because of the relatively large amount of silicon area needed. The large charge pumping circuits also draw high operating power, which is in contrast to the need for the low power operation necessary for long battery life.

Another problem with the use of EPROM devices is the relatively long programming time, typically tens of microseconds. Programming times are lengthened by the reduction in channel current as the cell is programmed. As is known in the art, channel current is reduced as the device threshold is raised, which is done by the programming operation.

One attempt to overcome some of the limitations of previous EPROM devices has resulted in an EPROM device capable of programming with lower voltage and power. The industry developed a floating-gate flash EEPROM with channel-initiated secondary electron injection (CISEI). The CISEI device creates a programming environment in which the electrons injected into the floating-gate are secondary electrons heated by impact ionization feedback. The CISEI process is initiated by impact ionization in the channel of the device. Vertical electrical fields, perpendicular to the flow of electrons in the channel, impart energy to the secondary electrons, enabling their injection over a potential barrier and onto the floating-gate. Examples of these vertical fields include the field between the substrate and drain, and the field between the substrate and oxide interface near the drain edge. As a result, the CISEI device is capable of programming with lower drain to source voltage (~3.3 v), lower gate to source voltage (~5 v) and lower drain current (~20 $\mu$A/cell). However, since channel conduction is necessary during programming, CISEI devices still require gate to source voltage higher than the desired programmed threshold voltage which is on the order of at least 1.5 volts above VDD. Even using CISEI programming, the required programming gate to source voltage is typically on the order of at least 2.5 volts above VDD, thus still requiring high voltage transistors and charge pumping circuits.

The CISEI device is also subject to undesirable "over-erasure" problems, which tends to age the EEPROM device prematurely as well as make the cells harder to program. Moreover, as described above, programming times are still lengthened by the reduction in channel current as the cell is programmed. A more detailed description of the CISEI process is set forth in U.S. Pat. No. 5,659,504, which is specifically incorporated herein by reference.

Accordingly, what is needed in the art is a semiconductor device that programs with gate to source and drain to source voltages of Vdd or less, does not have over-erasure problems and does not require the high programming power, voltages and long programming durations, as encountered in the prior art.

SUMMARY OF THE INVENTION

The present invention provides a semiconductor device that includes a tub region located in a semiconductor substrate, with the tub regions having a tub electrical contact connected thereto. The semiconductor device also includes a trap charge insulator layer located on the first insulator layer and a control gate located over the trap charge insulator layer. The control gate has a gate contact connected thereto for providing a second bias voltage to the semiconductor device that during programming is opposite in polarity to that of the first bias voltage.

The present invention also provides a method of manufacturing an integrated circuit. The method may include forming a tub region in a semiconductor substrate, with the tub region having a tub electrical contact connected thereto, forming a trap charge layer over the semiconductor substrate, and forming a control gate over the trap charge layer.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
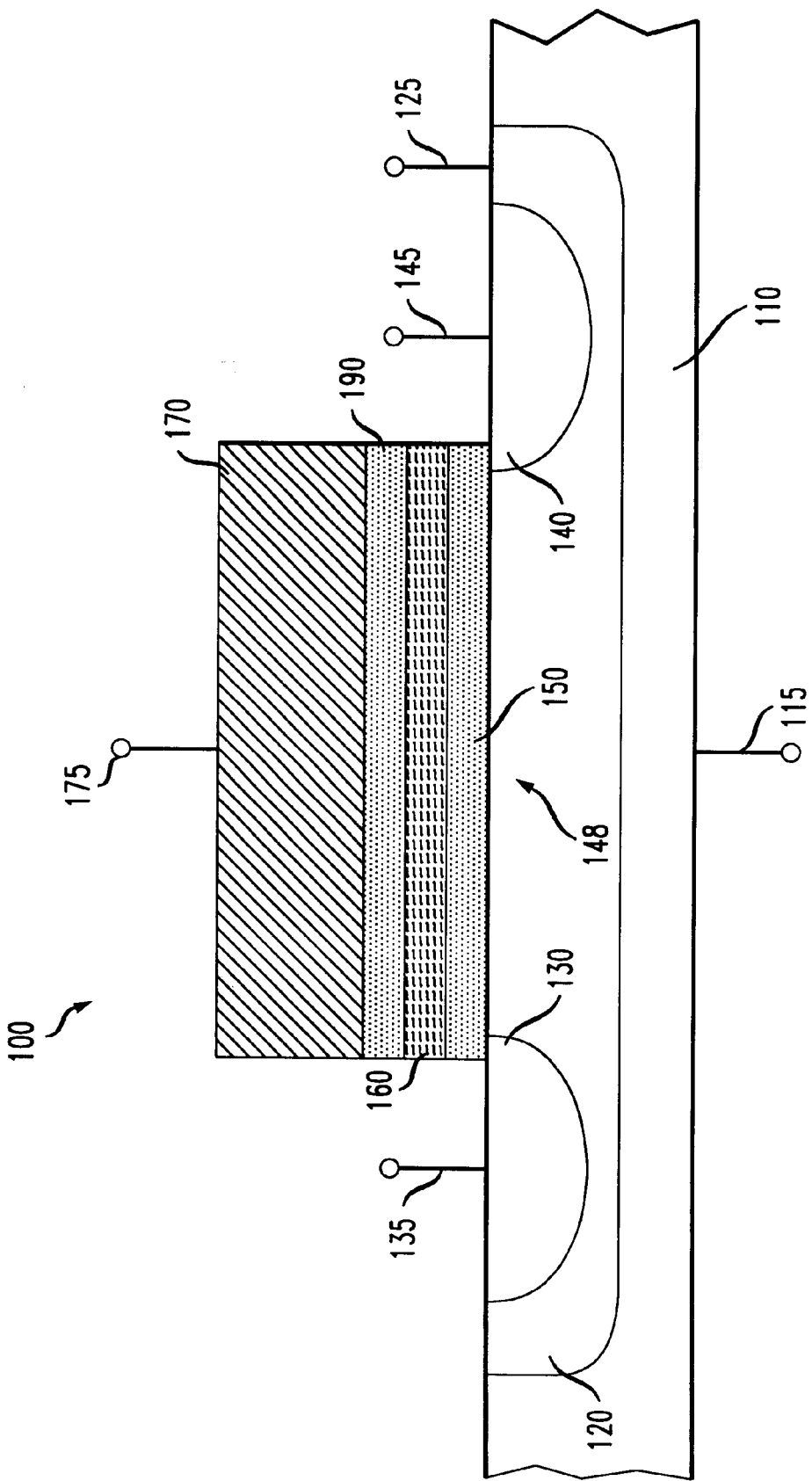
FIG. 1 illustrates a partial sectional view of a completed EPROM, covered by the present invention.

In an illustrative embodiment as presented in FIG. 1, the present invention provides a memory semiconductor device 100 that has a tub region 120 in a semiconductor substrate 110 wherein the tub region 120 has an electrical contact 125 connected thereto. This embodiment further includes a trap charge layer 160 located over the semiconductor substrate 110. The semiconductor device 100 provides benefits from the combination of the tub electrical contact 125 in the tub region 120 and the trap charge 160 layer as compared to prior art devices. One of the advantages provided by the present invention is lower programming voltages. The tub electrical contact 125 provided in the tub region 120 allows the application of a bias voltage to the tub electrical contact 125 that creates a vertical electrical field near a drain to tub junction. This vertical electrical field tends to impart sufficient energy to some of the electrons, created by providing a bias between the source and drain, to overcome a potential barrier of an insulator 150, and therefore enter the trap charge layer 160. As a result, lower power may be required to program the device. In addition, since the trap charge layer 160 is present, the charge may be trapped in a localized region of the trap charge layer 160. As a result, the cell threshold, under programming bias conditions, may not necessarily increase, and thus the channel programming current may not necessarily decrease as the cell is programmed. This may add the additional benefits of lower programming power and shorter programming times.

With continued reference to FIG. 1, illustrated is a partial sectional view of the completed EPROM 100 according to an exemplary embodiment of the present invention. In this particular illustration, the tub region 120 has been conventionally formed in a semiconductor wafer substrate 110, such as an EPI layer, which may be oppositely doped from the tub region 120. In the illustrative NMOS device, the tub region 120 has been conventionally doped with a p-type dopant. Also, the tub region 120 has a tub electrical contact 125 connected thereto for providing a bias voltage (Vts) to the EPROM device 100. In the present embodiment, the semiconductor substrate 110 has a substrate electrical contact 115 connected thereto for providing a ground for the EPROM device 100. The substrate 110 may be any layer located in a semiconductor device 100, including a layer located at wafer level or a layer located above wafer level.

Also illustrated in FIG. 1 are a source region 130 and a drain region 140 conventionally formed within the tub region 120. The tub region 120 preferably has an opposite polarity of dopant from the source region 130 and drain region 140. Thus, when the tub region 120 is conventionally doped with a p-type dopant, the regions 130, 140, should be conventionally doped with an n-type dopant. Additionally, the source region 130 and drain region 140 have electrical contacts 135, 145, respectively. The electrical contacts 135, 145, provide a bias voltage between the drain 140 and source 130 (Vds) to the EPROM device 100, and during programming, are opposite in polarity to that of the bias voltage provided by the tub contact 125. Also, located between the source region 130 and drain region 140 is a source/drain channel region 148.

A first insulator layer 150 is located on the substrate 110 with at least a portion being located over the regions 130, 140. In one embodiment of the invention, the first insulator layer 150 may comprise silicon dioxide ($SiO_2$). However, in alternative embodiments, other materials known to those who are skilled in the art and having similar insulation properties, may be used.

Located on the first insulator layer 150 is a trap charge insulator layer 160. The trap charge insulator layer 160 may, in an illustrative embodiment, be a silicon nitride (SiN) layer. A more detailed description of trapped charge layers included in the present invention, is set forth in U.S. Pat. No. 5,768,192, which is incorporated herein by reference.

Figure 2:
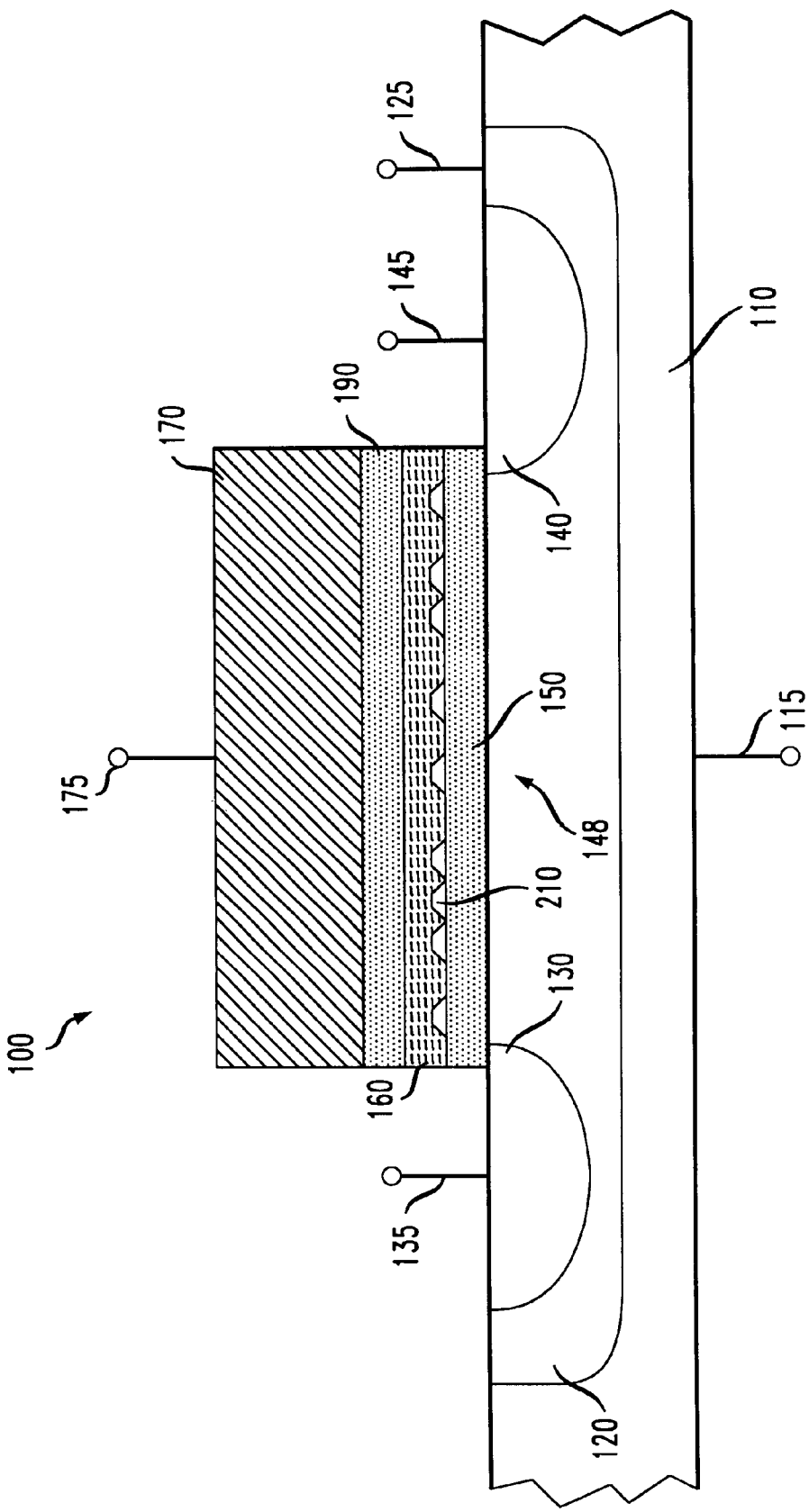
FIG. 2 illustrates the EPROM device of the present invention, with a trap charge insulator layer comprising a SiO$_2$ layer with micro-crystal structures.

In an alternative embodiment, however, the trap charge insulator layer 160 may comprise a $SiO_2$ layer containing micro-crystal islands, such as polysilicon crystal islands. An illustrative embodiment of this particular aspect of the present invention is shown in FIG. 2. As illustrated in FIG. 2, the EPROM device 100 of the present invention includes a trap charge insulator layer 160 comprising a $SiO_2$ layer containing polysilicon crystal islands 210. The trap charge insulator layer 160 illustrated in FIG. 2 may be manufactured by conventionally depositing a thin layer of polysilicon to form the polysilicon crystal islands 210. After formation of the polysilicon crystal islands 210, a conformal layer of $SiO_2$ is conventionally formed, completing the trap charge insulator layer 160.

Referring again to FIG. 1, formed over the trap charge insulator layer 160 is a control gate 170. The control gate 170, in an illustrative embodiment, comprises polysilicon; however, one skilled in the art would recognize that other similar materials may be used in place of polysilicon. The control gate 170 has a gate contact 175 connected thereto, for providing a bias voltage between the gate 170 and source 130 (vgs) to the EPROM 100. During programming, this bias voltage is preferably opposite in polarity to that of the bias voltage provided by the tub contact 125.

One having skill in the art knows that other insulator layers may be conventionally formed within the EPROM device 100 if design specifications require so. In the illustrated embodiment, a second insulator layer 190 has been conventionally formed between the control gate 170 and trap charge insulator layer 160. As with the first insulator layer 150, the second insulator layer 160 may comprise $SiO_2$, or any other material having similar insulation properties.

As a result of the specific structure of the EPROM device 100, including the tub region 120 having a tub electrical contact 125 connected thereto and the trap charge insulator layer 160, the EPROM device 100 can be written to using lower voltage and power. For instance, the EPROM device 100 of the present invention may be written to, or programmed, by applying a specified source voltage (Vs), drain voltage (Vd), gate voltage (Vg), tub voltage (Vt) and substrate voltage (Vb); thus, creating a first bias voltage (Vts), second bias voltage (Vgs) and third bias voltage (Vds). In one embodiment, during programming, Vgs ranges from about 1.8 volts to 3.0 volts, Vds ranges from about 1.8 volts to about 3.0 volts and Vts ranges from about −0.5 to about −3.0 volts. Furthermore, in a preferred embodiment, Vs is about zero and Vb is about zero. One having skill in the art knows that other voltages and biases could be used if the design of the device requires so.

Figure 3:
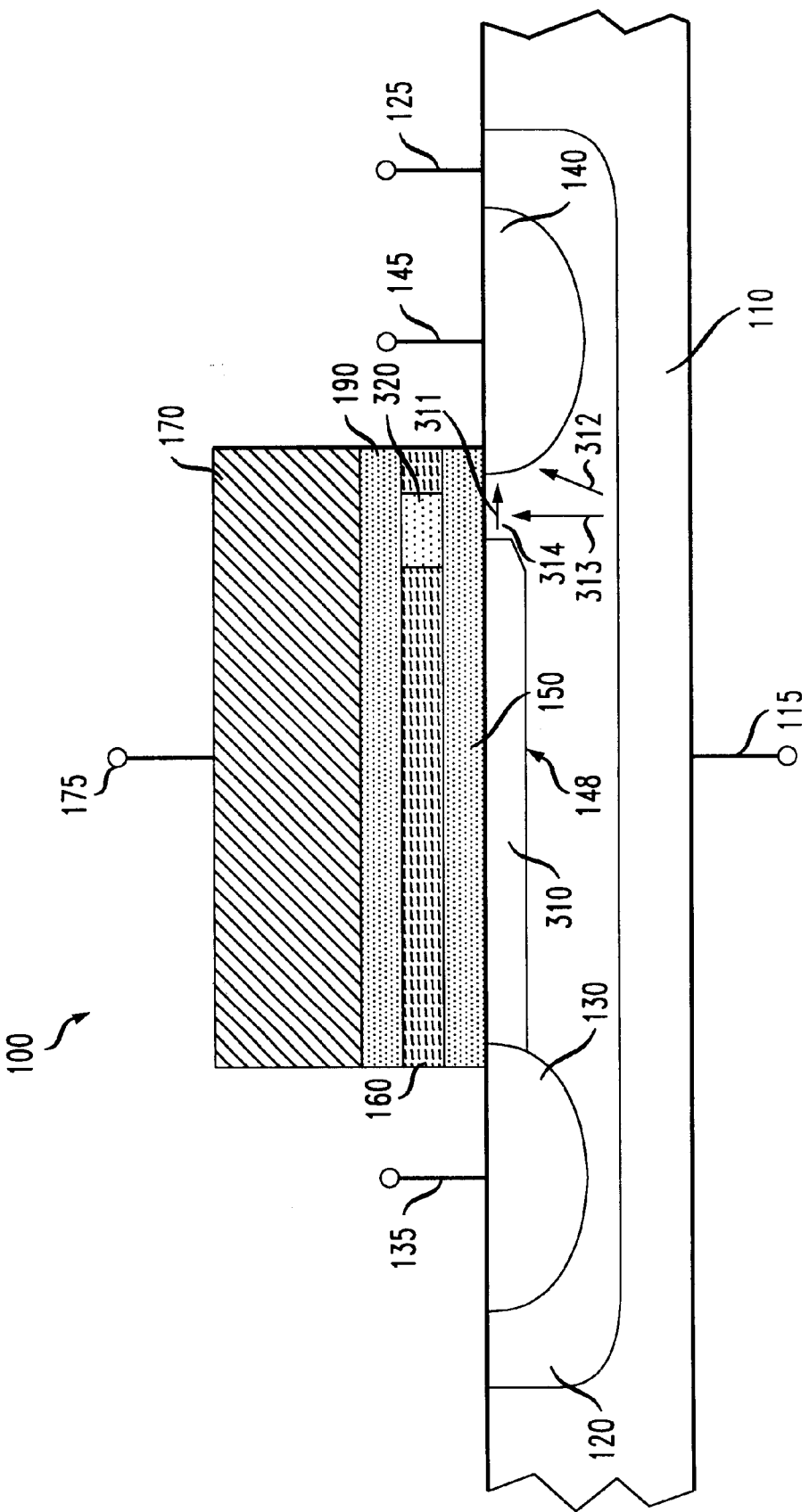
FIG. 3 illustrates the EPROM device of the present invention during programming.

Referring to FIG. 3, when voltages like those described in the embodiment above are applied to the EPROM device 100, charge inversion results in the channel's being conductive. The inversion region 310 is shown in FIG. 3. A lateral electric field 311 exists in a channel pinch-off region 314 near the drain, and a vertical electric field 312 exists between the substrate 110 and drain 140. Another vertical electric field 313 exists between the substrate 110 and the oxide layer 150 near the drain 140 edge. The lateral electric field 311 causes electrons from the source 130 to travel through the conductive channel inversion region 310 and accelerate toward the drain region 140. These electrons cause impact ionization near the drain to tub junction with the resulting holes being accelerated through the tub toward the oxide layer 150 by the vertical field 312. The holes, in turn, cause impact ionization within the tub with the resulting electrons being accelerated toward the substrate's 110 surface and the oxide layer 150 near the drain by vertical field 313. The vertical field 313 imparts sufficient energy to some of these electrons that they overcome the potential barrier of the first insulator layer 150.

Once the electrons have enough energy to overcome the potential barrier of the first insulator layer 150, those electrons can be trapped in a localized region 320 of the trap charge layer 160 near the drain region 140. Because the traps are located above the pinch-off region 314 near the drain region 140, the cell threshold, under programming bias conditions, does not increase and thus the channel programming current does not decrease as the cell is programmed. This allows for shorter programming times. Furthermore, fewer trapped charges are needed than the injected charge associated with programming floating gate flash. This is because the trap charge layer is nonconductive.

Thus, the entire trap charge insulator layer 160 does not have to be charged, as with a conductive floating gate layer. The reduced amount of charge needed to program, results in lower programming power than that required for programming the CISEI floating-gate EPROM. Furthermore, the possibility of over-erasure can be eliminated as a consequence of the localization of the programming trapped charge over only a small portion of the channel. When read, the remaining portion of the channel has a threshold that may be unchanged by erasing and programming operations, and fixed during manufacture to be above 0 volts but below VDD. Thus, with cells arranged along a column of a memory array, as is well known in the art, deselected cells, those with their gates at ground potential, will not conduct even when erased.

In an exemplary embodiment of the invention, erasing the EPROM cell 100 of the invention is similar to erasing floating-gate EPROM cells programmed by CHEI or CISEI. As is known in the art, erase can be performed by Fowler-Nordheim tunneling of electrons from the trap charge region 320 to the tub 120. This is caused by applying a high positive voltage of about 4 volts to about 12 volts to the tub and, optionally, a negative bias of about −2.0 volts to about −8.0 volts to the control gate 170. Another method of erase, also known in the art, is hot hole injection from the drain to the trap charge region. This is caused by applying a high positive voltage of about 4.0 volts to about 8.0 volts to the drain 140 and, optionally, a negative bias of about −2.0 volts to about −6.0 volts to the control gate.

In another exemplary embodiment of the invention, reading the EPROM cell 100 of the invention is similar to reading floating-gate EPROM cells programmed by CHEI or CISEI. Except for Vgs, similar biases are used with Vs and Vt of about 0.0 volts and Vds of about 1.0 volts or less. Floating-gate EPROM cells are sometimes read with a gate to source voltage, Vgs, boosted above VDD. Due to a relatively high erased cell threshold, caused by a technique used to avoid over-erasure of floating-gate EPROM, it is necessary to provide a high Vgs, above VDD, to obtain the desired cell current during read operations.

Without this higher cell current, memory read access times would be undesirably increased. In the present invention, the desired read current is obtainable with gate to source voltage, Vgs, of VDD. This is achievable because the threshold of most of the channel region is set with precision at the desired value during manufacture, and the threshold of the portion of the trap charge layer 320 where electrons are stored during programming and removed from during erasing can be set to below 0 volts during erase.

The memory cells of the invention can be arranged in an array of rows and columns as is well known in the art. Flash EEPROM memory cells are typically arranged in sectors. A sector is a group of cells that are erased at the same time but not necessarily at the same time as those in other sectors. Typically a memory array will contain one or more sectors. With the cells of the invention, all cells within a sector would share the same common tub. This allows for erasing only those cells within one sector while not erasing cells in other sectors.

Figure 4:
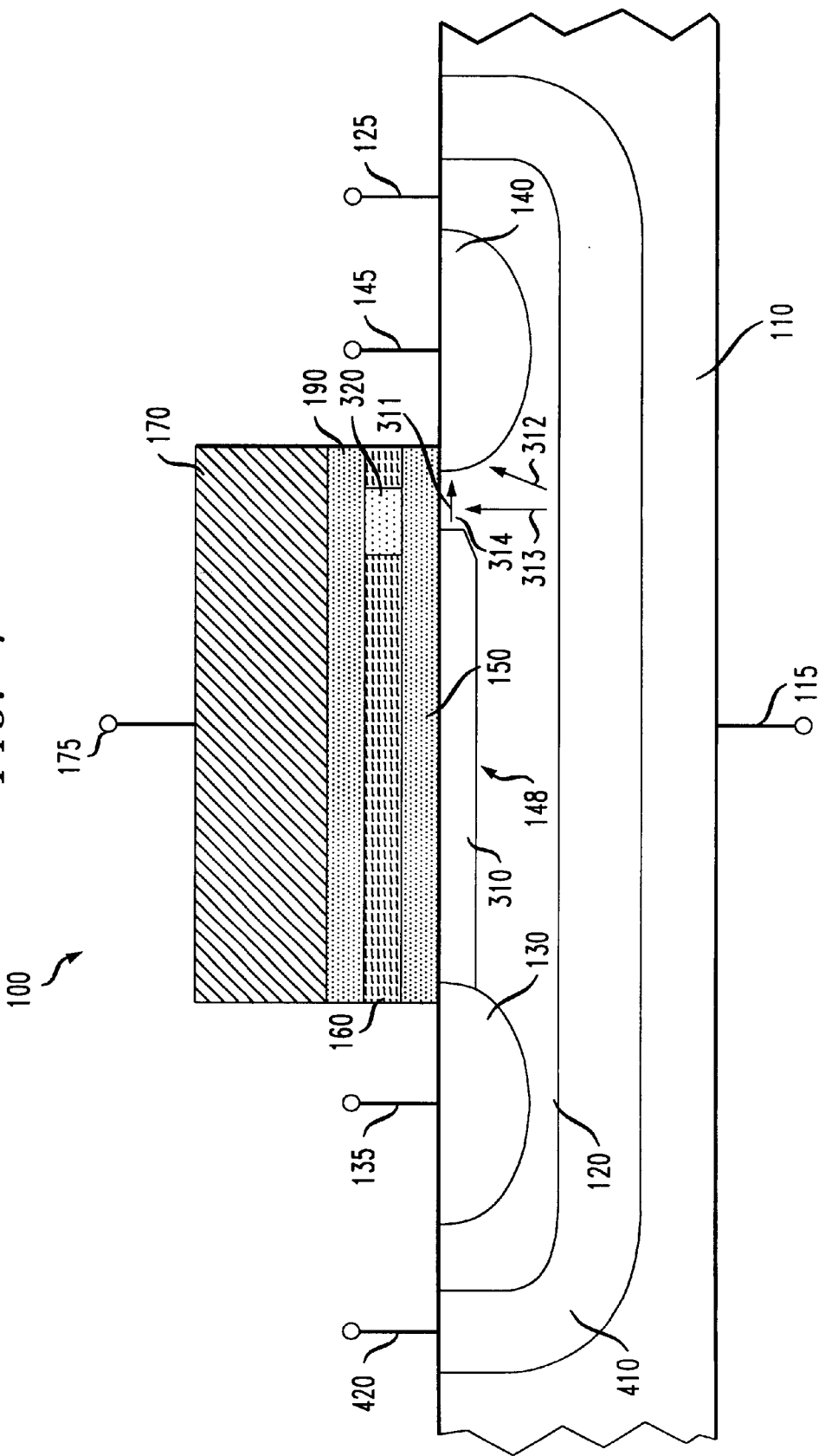
FIG. 4 illustrates an embodiment of the present invention wherein a first tub is located within a second tub.

It is known by those skilled in the at that this invention could also be implemented with a second tub 410 residing within the semiconductor substrate and having the first tub 120 located within the second tub 410, as illustrated in FIG. 4. Furthermore, in this implementation, the substrate 110 may be p-type, the second tub 410 may be n-type, and the first tub 120 may be p-type as well. Also, the n-type source, n-type drain and source/drain channel region are placed within the first tub 120. Furthermore, there is a second tub electrical contact 420 which is typically connected to the substrate contact 115 and there is the first tub electrical contact 125 to apply the voltages as previously described.

It is known by those skilled in the art that this invention could also be implemented without a tub residing within a semiconductor substrate, by placing the n-type source, n-type drain and channel region directly within a p-type semiconductor substrate. However, it should also be noted that the current invention is not restricted to p-type tub regions and n-type source and drain regions, i.e., an NMOS device, and that other devices could benefit from the present invention.

In the illustrated embodiment, the EPROM device 100 is being read in the forward direction; however, one having skill in the art knows that the EPROM device 100 could be read in the reverse direction. This is accomplished by reversing the source and drain biases, which allows for the storage of two bits of information per EPROM device 100.

Figure 5:
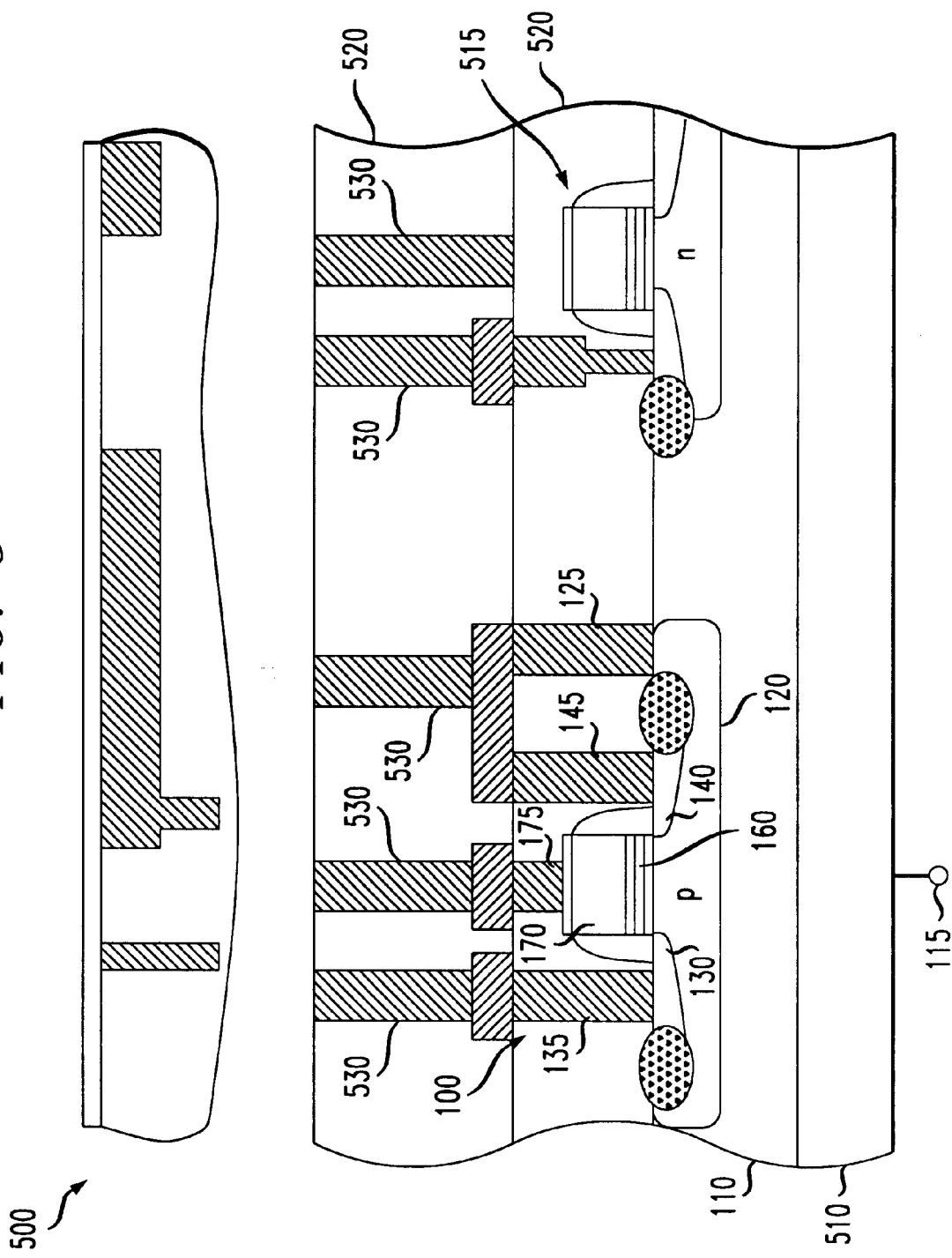
FIG. 5 illustrates a cross-sectional view of a conventional integrated circuit incorporating the EPROM device illustrated in FIG. 1.

Turning briefly to FIG. 5 with continued reference to FIG. 3, illustrated is a cross-sectional view of a conventional integrated circuit 500 incorporating the EPROM device 100 constructed according to the principles of the present invention. FIG. 5 illustrates the various components of the EPROM device 100 that are discussed above. In addition, conventional interconnects 530, which are formed in interlevel dielectric layers 520, are shown and a conventional transistor 515 that may be used to form a conventional semiconductor device, such as a complementary metal oxide semiconductor CMOS. Both the EPROM device 100 and the conventional transistor 515 are located over a semiconductor wafer 510. The interconnect structures 530 may be located within the interlevel dielectric layers 520 and electrically connect the EPROM device 100 and the transistor 515 to form an operative integrated circuit 500 having memory devices associated therewith.

Although the present invention has been described in detail, those skilled in the art should understand that they can make various changes, substitutions and alterations herein without departing from the spirit and scope of the invention in its broadest form.

What is claimed is:

1. An integrated circuit, comprising:
   a tub region located in a semiconductor substrate and having a tub electrical contact connected thereto, wherein the tub electrical contact is configured to receive at least two different voltages;
   a trap charge layer located over the semiconductor substrate; and
   a control gate located over the trap charge layer.

2. An integrated circuit as recited in claim 1 further including a first insulator layer located on the semiconductor substrate, at least a portion of the first insulator being located over a source/drain channel region.

3. An integrated circuit as recited in claim 2 wherein the source/drain channel region is between a source region and a drain region located in the tub, the source and drain regions each having an electrical contact connected thereto for providing a source/drain bias voltage to the semiconductor device opposite in polarity to that of a tub/source bias voltage.

4. An integrated circuit as recited in claim 3 wherein the tub is doped with a p-type dopant and the source and drain regions are doped with an n-type dopant.

5. An integrated circuit as recited in claim 1 further including a second insulator layer located on the trap charge layer and wherein the control gate is located on the second insulator layer.

6. An integrated circuit as recited in claim 1 wherein the trap charge layer is a silicon nitride layer.

7. An integrated circuit as recited in claim 1 wherein the trap charge layer is a silicon dioxide layer containing microcrystal structures.

8. An integrated circuit as recited in claim 1 further including a substrate electrical contact connected thereto for providing a ground for the semiconductor device.

9. An integrated circuit as recited in claim 1 wherein the tub region is oppositely doped from the substrate.

10. An integrated circuit as recited in claim 1 wherein the control gate comprises polysilicon.

11. An integrated circuit as recited in claim 1 wherein the integrated circuit is an electrically programmable read-only memory (EPROM) device.

12. An integrated circuit as recited in claim 11 wherein the EPROM device is an electrically erasable programmable read-only memory (EEPROM) device.

13. An integrated circuit as recited in claim 1 wherein the tub region is a first tub region and further including a second tub region, wherein the first tub region is located within the second tub region.

14. An integrated circuit as recited in claim 13 wherein the substrate is doped with a p-type dopant, the second tub region is doped with an n-type dopant and the first tub region is doped with a p-type dopant.

15. An integrated circuit, comprising:
   transistors located on a wafer;
   an electrically programmable read-only memory device (EPROM), including:
      a tub region located in a semiconductor substrate and having a tub electrical contact connected thereto, wherein the tub electrical contact is configured to receive at least two different voltages;
      a trap charge layer located over the semiconductor substrate; and
      a control gate located over the trap charge layer and having a gate contact connected thereto; and
   dielectric layers located over the transistors and the EPROM device and having interconnect structures located therein that electrically connect the transistors and the EPROM device to form the integrated circuit.

16. An integrated circuit as recited in claim 15 further including a first insulator layer located on the semiconductor substrate, at least a portion of the first insulator layer being located over a source/drain channel region.

17. An integrated circuit as recited in claim 16 wherein the source/drain channel region is between a source region and a drain region located in the tub, the source and drain regions each having an electrical contact connected thereto for providing a source/drain bias voltage to the semiconductor device opposite in polarity to that of a tub/source bias voltage.

18. An integrated circuit as recited in claim 17 wherein the tub is doped with a p-type dopant and the source and drain regions are doped with an n-type dopant.

19. An integrated circuit as recited in claim 16 further including a second insulator layer located on the trap charge layer and wherein the control gate is located on the second insulator layer.

20. An integrated circuit as recited in claim 15 wherein the trap charge layer is a silicon nitride layer.

21. An integrated circuit as recited in claim 15 wherein the trap charge layer is a silicon dioxide layer containing microcrystal structures.

22. An integrated circuit as recited in claim 15 wherein the semiconductor substrate includes a substrate electrical contact connected thereto for providing a ground for the semiconductor device.

23. An integrated circuit as recited in claim 22 wherein the tub region is oppositely doped from the substrate.

24. An integrated circuit as recited in claim 15 wherein the integrated circuit includes a complementary metal oxide semiconductor (CMOS) device.

25. An integrated circuit as recited in claim 15 wherein the tub region is a first tub region and the integrated circuit further includes a second tub region with the first tub region located within the second tub region.

26. An integrated circuit as recited in claim 25 wherein the substrate is doped with a p-type dopant, the second tub region is doped with an n-type dopant and the first tub region is doped with a p-type dopant.

27. An array of trap charge layer memory cells, comprising:
   at least two cells having a source region and a drain region formed in a tub residing within a semiconductor substrate;
   a dielectric layer deposited on the substrate;
   a trap charge layer formed over the dielectric layer;
   a second dielectric layer formed over the trap charge layer;
   a control gate formed over the second dielectric layer and configured to provide a control gate to source bias of less than about 5 volts; and
   a tub connection configured to provide a negative tub to source bias of at least about −0.5 volts as well as at least two different voltages, wherein the current that charges the trap charge layer is initiated by the electron current from the source to the drain.

* * * * *